United States Patent

Milkovic

[11] 4,451,784
[45] May 29, 1984

[54] ELECTRONIC WATT TRANSDUCER CIRCUIT WITH CONSTANT DC CURRENT OUTPUT PROPORTIONAL TO WATTS

[75] Inventor: Miran Milkovic, Scotia, N.Y.

[73] Assignee: General Electric Company, Somersworth, N.H.

[21] Appl. No.: 313,275

[22] Filed: Oct. 21, 1981

[51] Int. Cl.³ .............................................. G01R 7/00
[52] U.S. Cl. ................................. 324/142; 324/107; 324/111
[58] Field of Search ........... 324/142, 107, 111, 123 R, 324/123 C

[56] References Cited

U.S. PATENT DOCUMENTS

| | | | |
|---|---|---|---|
| 3,746,851 | 7/1973 | Gilbert | 324/142 |
| 3,875,509 | 4/1975 | Milkovic | 324/142 |
| 3,947,763 | 3/1976 | Milkovic | 324/142 |
| 3,955,138 | 5/1976 | Milkovic | 324/142 |
| 4,145,652 | 3/1979 | Hayashi | 324/142 |

*Primary Examiner*—Stewart J. Levy
*Attorney, Agent, or Firm*—Robert E. Brunson

[57] ABSTRACT

An electronic wattmeter in the form of an electronic watt-transducer circuit requiring a minimum number of components that can be fabricated by monolithic semiconductor integrated circuit manufacturing techniques and which provides a direct current output signal that is proportional to watts. The electronic watt transducer circuit comprises a first transformer for developing a first voltage related signal proportional to the input voltage to be measured and a second current transformer for developing a second current related signal proportional to the input current to be measured. A pulse width modulator is connected to receive the first voltage related signal and an input repetitive sampling signal for producing repetitive pulse width modulated output pulses having instantaneous pulse width proportional to the corresponding instantaneous amplitude of the first voltage related signal. Double-pole, double-throw electronic switch multipliers are connected to be automatically switched in response to the repetitive pulse width modulated output signal to develop at the output thereof alternating polarity, pulse width and amplitude modulated signal pulses having instantaneous pulse widths proportional to the first voltage related signal and instantaneous amplitudes proportional to the second current related signal, and a DC component proportional to the product of the two and hence to the power consumption represented by the electric voltage and current being monitored. An averaging type current-to-current converter is connected to the output from the electronic switch multiplier for providing an output analog average direct current electric signal proportional to watts.

13 Claims, 6 Drawing Figures

ELECTRONIC WATT TRANSDUCER CIRCUIT WITH CONSTANT DC CURRENT OUTPUT PROPORTIONAL TO WATTS

TECHNICAL FIELD

This invention relates to an electronic wattmeter in the form of an electronic watt transducer circuit which requires a minimum number of components in the circuitry that are integrable and hence subject to manufacture using monolithic semiconductor integrated circuit techniques, and which provides a direct current output signal that is proportional to watts.

BACKGROUND ART

U.S. Pat. No. 3,955,138—issued May 4, 1976 for an "Electronic Energy Consumption Meter With Input Transformer Having Single Resistance Terminated Secondary Winding Coupled to CMOS Switches Driven By Pulse-Width Modulated Control Signals'-'—Miran Milkovic, Inventor and assigned to the General Electric Company, describes an electronic kilowatt power meter (KWH meter) which employs a minimum number of integral components and provides an output reading of kilowatt hours of electrical energy consumed by a facility being monitored. The present invention was devised to provide comparable compatible electronic circuitry capable of being fabricated in monolithic semiconductor integrated circuit form and which provides an output direct current signal proportional to watts being consumed by a facility being monitored.

SUMMARY OF INVENTION

It is therefore a primary object of the present invention to provide an improved electronic wattmeter comprising an electronic watt transducer circuit requiring a minimum number of integrable components which provides a direct current output signal that is proportional to watts.

In practicing the invention, an improved electronic energy consumption wattmeter is provided for monitoring alternating current electrical energy being consumed by a facility being supplied with electricity. The improved electronic wattmeter comprises an electronic watt transducer circuit including a first transformer having a primary winding excited by the voltage to be measured and a secondary winding providing a first voltage related signal proportional to the voltage of the alternating current energy being supplied. A second transformer is provided having a primary winding excited by the current to be measured and a secondary winding providing a second current related signal proportional thereto. In preferred embodiments of the invention, the secondary winding of the second transformer has a fixed resistance of predetermined value connected in shunt across the secondary winding for developing the second current related signal thereacross. A pulse-width modulator is provided for each phase of the supply alternating current energy and is operatively connected to receive the first voltage related signal and is responsive to a repetitive sampling signal having a sampling frequency $f_s$ for producing repetitive modulated output pulse signals having instantaneous pulse widths proportional to the corresponding instantaneous magnitude of the first voltage related signals. Double-pole, double-throw electronic switch multipliers are operatively connected to be automatically switched between first and second operating states in response to the repetitive modulated output pulse signals derived from the pulse-width modulators. The electronic switch multipliers have first and second inputs connected across the secondary winding of the second transformer and have a switch output which is controllably and alternately connected between the first switch input during the first switch operating state and to the second switch input during the second operating state of the switch, respectively, in response to the modulated output signals from the pulse-width modulator. Resultant output electric signal pulses are derived from the electronic switch multipliers which have instantaneous pulse widths proportional to the first voltage related signal and instantaneous amplitudes proportional to the second current related signal and a D.C. component proportional of the product of the first voltage related signal and the second current related signal and hence to the power consumption of the facility being monitored. The improved electronic wattmeter is completed by an averaging type current-to-current converter which is connected to the output from the electronic switch multiplier and supplied with the alternating polarity, resultant pulse width and amplitude modulated output signal pulses for averaging the output signal pulses over a full cycle of the alternating current electric energy being monitored and providing an output analog direct current electric signal proportional to watts.

Another feature of the invention is the provision of an improved electronic wattmeter having the characteristics set forth above wherein the averaging type current-to-current converter comprises an integrating type operational amplifier having an averaging low pass filter connected in the negative feedback loop thereof for integrating and averaging the alternating polarity, resultant pulse width and amplitude modulated output signal pulses from the electronic multiplier switches over a full operating period of the alternating current energy being monitored.

A still further feature of the invention is the provision of a poly-phase electronic wattmeter having the characteristics described above wherein there is provided a first transformer, a second transformer, a pulse-width modulator and a double-pole, double-throw electronic switch multiplier for each phase and further includes summing means for summing the resultant, alternating polarity, pulse width and amplitude modulated output signal pulses appearing at the output of the electronic switch multiplier for each of the phases together at the input to the averaging type current-to-current converter whereby the output analog direct current signal appearing at the output of the current-to-current converter is representative of the total watts being supplied by the poly-phase system.

BRIEF DESCRIPTION OF DRAWINGS

Other objects, features and many of the attendant advantages of the present invention will become better understood upon a reading of the following detailed description when considered in conjunction with the accompanying drawings, wherein like parts in each of the several figures are identified by the same reference character, and wherein.

BEST MODE OF PRACTICING THE INVENTION

Figure 1:
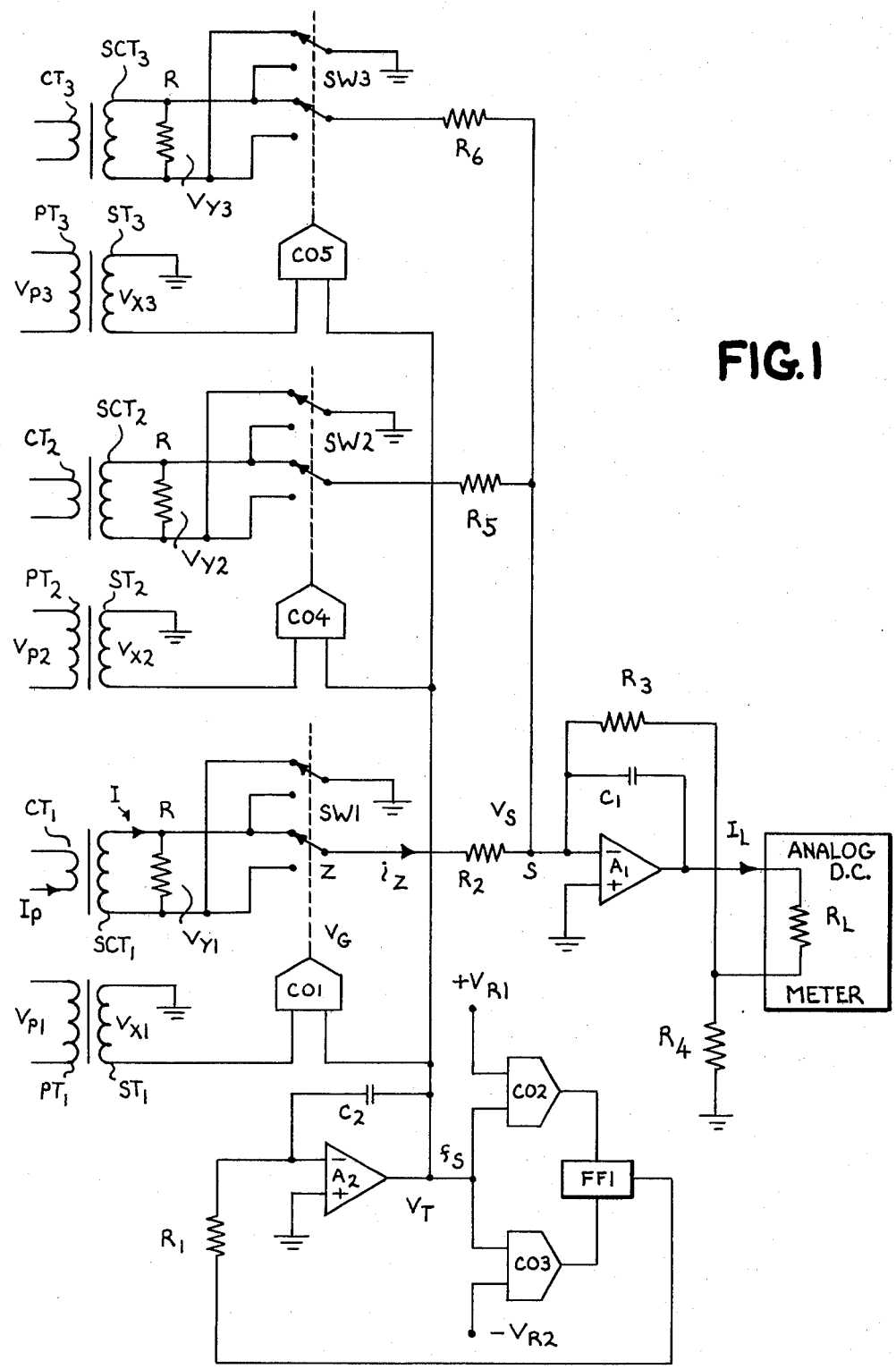
FIG. 1 is a schematic circuit diagram of an improved poly-phase electronic transducer circuit according to the invention which provides a constant output current proportional to watts.

FIG. 1 is a functional schematic circuit diagram of a poly-phase electronic watt-transducer circuit constructed according to the invention. The circuit of FIG. 1 constitutes a three-phase circuit wherein each of the phases is comprised by a first transformer means having a primary winding $PT_1$, $PT_2$ and $PT_3$ which is excited by a voltage $V_P$ to be measured. Each of the first transformer means also has a secondary winding $ST_1$, $ST_2$ and $ST_3$ which is inductively coupled to their respective primary winding and across which are developed first voltage related signals $v_{X1}$, $v_{X2}$ and $v_{X3}$ which are proportional to the respective primary voltages $V_{P1}$, $V_{P2}$ and $V_{P3}$.

The poly-phase electronic watt-transducer circuit of FIG. 1 further includes second transformer means comprised by current transformers for each of the three phases having primary windings $C_{T1}$, $C_{T2}$ and $C_{T3}$ each of which are supplied with currents $I_P$ to be measured. Inductively coupled to the current transformer primary windings are respective secondary windings $SCT_1$, $SCT_2$ and $SCT_3$ each of which have a fixed resistance R connected thereacross for developing a second current related signal $v_{Y1}$, $v_{Y2}$ and $v_{Y3}$ each of which are proportional to the respective primary current $I_P$ flowing in the primary windings thereof. By reason of the transformer supply of both the voltage related and the current related signals to the watt-transducer circuitry described hereafter, isolation from the power line voltage and current levels is provided for the electronic wattmeter.

The electronic watt-transducer circuit further includes three similar double-pole, double-throw electronic switch multiplier means SW1, SW2 and SW3 which are under the control of pulse-width modulator means CO1, CO4 and CO5, respectively. The pulse-width modulators CO1, CO4 and CO5 (as well as CO2 and CO3 to be described hereafter) may be of the type illustrated and described with relation to FIGS. 14 and 20 of U.S. Pat. No. 3,875,509—issued Apr. 1, 1975 for an "Electronic Metering Of Active Electrical Energy"—Miran Milkovic, inventor and assigned to the General Electric Company. For a more detailed description of the pulse-width multiplier construction and operation, reference is made to U.S. Pat. No. 3,875,509; however, briefly it can be stated that the pulse-width multipliers constitute comparators which are supplied with a triangular wave-shaped sampling voltage having a frequency $f_s$ from a triangular wave-shaped generator comprised by the elements CO2, CO3, FF1 and A2 shown at the bottom of FIG. 1. The input voltage related signal $v_{X1}$ is supplied to one input of the comparator and the triangular wave-shaped sampling voltage is supplied to the remaining input to produce a pulse-width modulated signal pulse $v_g$ at the output having an instantaneous pulse width which is proportional to the corresponding instantaneous magnitude of the first voltage related input signal $v_{X1}$. Typically, the sampling frequency $f_s$ of the triangular wave-shaped input signal, and hence the frequency of the pulse-width modulated output signal $v_q$ is fixed at some relatively high value on the order of 10,000 Hertz, for example, compared to a line frequency of 60 Hertz so that a large number of width-modulated pulses $v_g$ are produced during each cycle of the line voltage/current being supplied to the primary windings PT1 and CT1 of the first voltage and second current transformers. In view of the fact that each of the remaining phases employing pulse-width modulators CO4 and CO5 and their respective electronic switch multipliers SW2 and SW3 are identical in construction and operation, only the phase employing pulse-width modulator CO1 and electronic switch multiplier SW1 will be described.

The construction and operation of the double-pole, double-throw electronic switch multiplier SW1 (as well aas SW2 and SW3) is described in detail in U.S. Pat. No. 3,947,763—issued Mar. 30, 1976 for a "CMOS Electronic KWH Meter and Method for Metering Electrical Energy"—Miran Milkovic, inventor and assigned to the General Electric Company, and reference is made to U.S. Pat. No. 3,947,763 for a detailed description of the multipliers. Briefly, however, it should be noted that the multiplier switches such as SW1 are controlled by the output $v_g$ of the pulse-width modulator CO1. Each of the switches such as SW1 have two sets of reverse connected input terminals so that in a full cycle of operation of SW1, the second current related voltage $v_{Y1}$ having one polarity will appear across the output terminal Z and for the alternate operating state of switch SW1, the reverse polarity of the $v_{Y1}$ appears at Z. The instantaneous amplitude of the voltage $v_{Y1}$ during each switching interval will or course be directly related to the instantaneous amplitude of the voltage $v_{Y1}$ appearing across the fixed resistor R and hence proportional to the current $I_P$ flowing in the primary winding CT1. This alternate switching of the polarity of $v_{Y1}$ across the output terminal Z is due to the fact that the upper part of the switch SW1 connectes intermittently with one side of $v_{Y1}$ to ground. This creates a 180° phase inversion of $v_{Y1}$ each time that $v_g$ actuates the switch SW1 and causes it to change polarity. The pulse current $i_Z$ produced at the output of output terminal Z is thus a pulse train of alternating polarity pulses having a variable pulse width and a variable amplitude at a repetition frequency $f_s$ determined by the repetition frequency of the triangular wave generator CO2, CO3, ff1 and A2. The amplitude of the pulses is modulated by $v_Y$ and the width of the pulses by $v_X$.

Figure 2A:
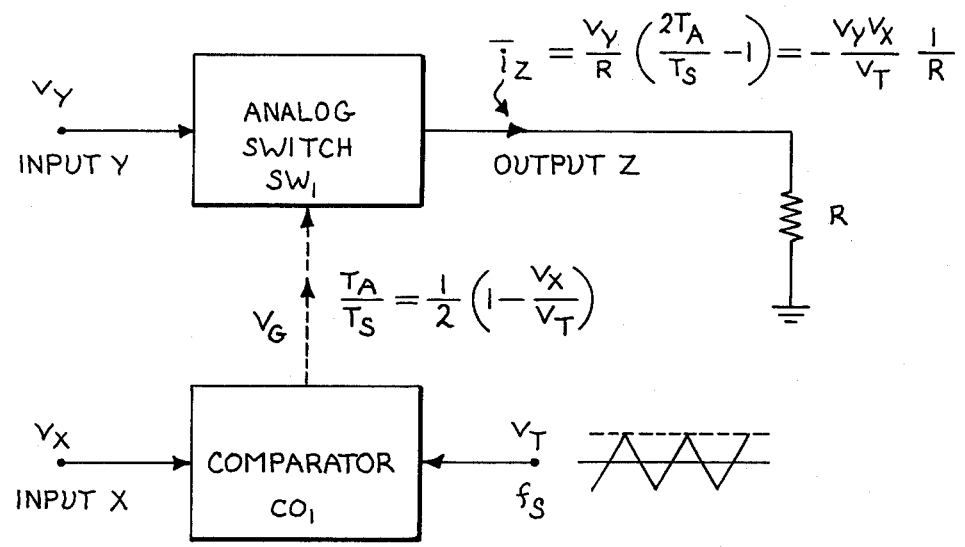
FIG. 2A is a functional block diagram of the electronic switch multiplier portion of the electronic watt transducer circuit shown in FIG. 1 and is useful in explaining operation of the circuit in conjunction with FIG. 2B of the drawings which is a current versus time waveform illustrative of the output signals derived from the output of the electronic multiplier switch.

FIG. 2A of the drawings is a functional block diagram which depicts operation of one of the multipliers and is comprised by the comparator CO1 and analog switch SW1. Comparator CO1 has the first voltage related input signal $v_X$ applied to one of its input terminals and the triangular sampling signal $V_T$ having a frequency $f_s$ applied to the remaining input terminal where $f_s >> f_L$ and $f_L$ is the line frequency of the alternating current energy being monitored. Comparator CO1 combines the two signals and produces an output pulse signal $v_G$ for controlling the analog switch SW1.

Figure 3:
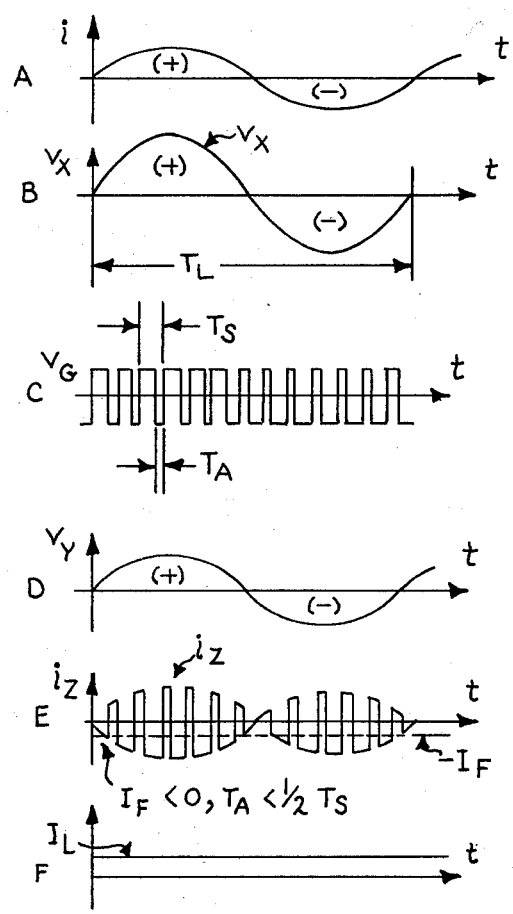
FIG. 3 illustrates a series of current and voltage versus time waveforms in FIGS. 3A through 3F which are useful in explaining operation of the watt-transducer circuit shown in FIG. 1 and illustrate the circuit while operating under a load condition.
Figure 4:
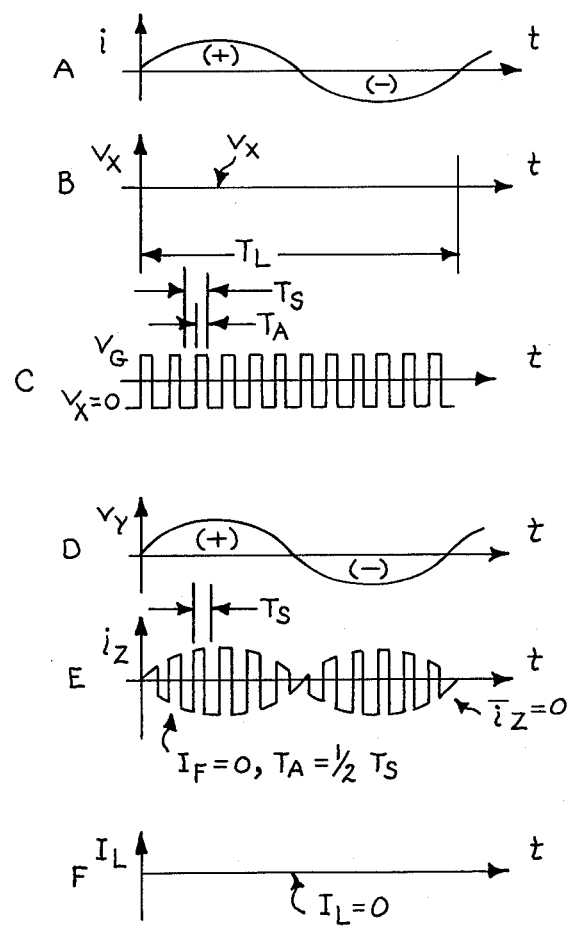
FIG. 4 is a series of current and voltage versus time characteristic curves illustrative of operation of the watt-transducer circuit of FIG. 1 under a no-load operating condition.

By applying the pulsed output sigal $v_G$ from comparator CO1 to control the analog switch SW1, an amplitude modulation is accomplished. For $v_X=0$, the signal $v_G$ consists of symmetrical pulses which then applied to the analog switch SW1 switches the second current related signal $v_Y$ to the output Z in equal time intervals so that the average value of $\bar{i}_Z$ in FIG. 2 becomes equal to zero as depicted in FIG. 4 of the drawings. For $v_X>0$, the $v_Z$ pulses are non-symmetrical so that the average value of $\bar{i}_Z$ becomes different from zero for FIG. 2 as shown in FIG. 3 of the drawings. The output current $\bar{i}_Z$ from the multiplier switch output SW1, averaged over a sampling period $T_S$ shown in FIG. 2B of the drawings, where $T_S=1/f_C$, is directly proportional to the product of $v_X$ and $v_Y$ and thus to instantaneous power.

Figure 2B:
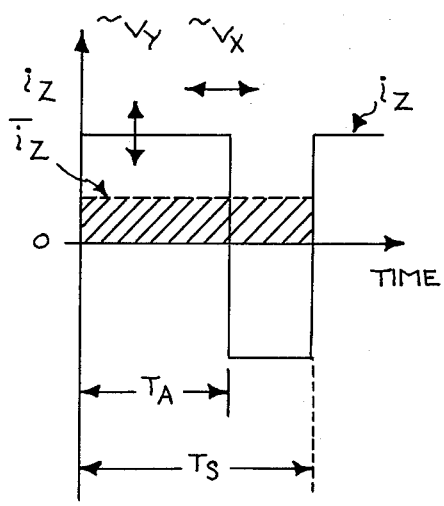

The ratio $T_A/T_S$ shown in FIG. 2B of the drawings is given by the expression:

$$\frac{T_A}{T_S} = \frac{1}{2}\left(1 - \frac{v_X}{v_T}\right) \quad (1)$$

The multiplier switch SW1 (as well as the switches SW2 and SW3 in the other two phases), is alternately switched by the signal $v_G$ from comparator CO1. A a result the upper part of SW1 intermittently connects one side of $v_Y$ to ground and the other side across the output resistor $R_2$ which corresponds to the resistor R shown in FIG. 2A. During the alternate half cycle the opposite side of $v_Y$ is connected to ground while the one side is connected across $R_2$ (R in FIG. 2A). This creates a 180° phase inversion of $v_Y$ each time $v_G$ changes its polarity. The resultant pulse width modulated and amplitude modulated output pulse train is in the form of a pulse current $i_Z$ having a frequency $f_S$ with variable pulse amplitude and variable pulse width. The amplitude of the pulses $i_Z$ is modulated by $v_Y$ and the pulse width by $v_X$ and is illustrated in FIG. 3E of the drawings for a condition $v_X>0$ and in FIG. 4E for a condition where $v_X=0$.

As can be seen from an examination of FIG. 1, the $i_Z$ signal pulse appearing at the output of the electronic multiplier switch SW1/$R_2$ (as well as resistors $R_5$ and $R_6$ for the other two phases), is applied at S to the input terminal of an operational feedback amplifier $A_1$. It will be recognized by those skilled in the art that the voltage $V_F$ at F is at virtually zero potential due to the feedback action of operational amplifier $A_1$. With this fact in mind, it then can be stated that the average value of the signal pulses $i_Z$ over the sampling period $T_S$ for a single phase is given by the expression:

$$\bar{i}_Z = \frac{1}{T_S} \int_0^{T_S} i_Z dt = \frac{1}{T_S}\left[\frac{v_Y}{R_2}[T_A - (T_S - T_A)]\right] = \quad (2)$$

$$= \frac{v_Y}{R_2}\left(\frac{2T_A}{T_S} - 1\right)$$

by combining equation (1) with equation (2) one gets:

$$\bar{i}_Z = -\frac{v_X v_Y}{V_T}\frac{1}{R_2} \quad (3)$$

where $\bar{i}_Z$ is the integral of $i_Z$ over the sampling period $T_S$ and represents the instantaneous power P (per phase).

The average power P is developed over a line period $T_L$ of the alternating current electric power being delivered where $T_L=1/f_L$ and $f_L$ is the supply line frequency of the alternating current power being monitored (normally 60 Hertz in the United States of America). Accordingly, the average power P is obtained by integration of $\bar{i}_Z$ over a line period $T_L$ and this is accomplished with the electronic watt transducer circuit of FIG. 1 by the averaging low-pass filter comprising $C_1$-$R_3$-$R_2$ connected in the feedback loop of the operational amplifier $A_1$ in FIG. 1 (as well as in FIG. 5 to be described hereafter). The average power P (per phase) with $v_X=K_1V_P \sin \omega t$ and $v_Y=K_2I_P \sin(\omega t - \theta)$, is proportional to:

$$I_F = \frac{1}{T_L}\int_0^{T_L} \bar{i}_Z dt = -K_1 K_2 K_3 V_P I_L \cos\theta \quad (4)$$

where $I_F$ is the average DC current flowing in $R_2$ in FIG. 1 (as well as in FIG. 5), $K_1$, $K_2$ and $K_3$ are dimensional constants determined primarily by the values of the resistors and their ratios, $\theta$ is the phase angle between $V_P$ and $I_P$, and $V_P$ and $I_P$ are the RMS values of the primary voltage and current, respectively, being monitored.

The current $I_F$ at this point is representative of the average power (per phase) measured over a full period $T_S$ of the sampling signal $V_S$.

The feedback operational amplifier $A_1$ together with the averaging low-pass filter $C_1$-$R_3$-$R_4$-$R_2$ connected in the negative feedback loop of operational amplifier $A_1$ comprises an averaging type current-to-current converter means connected to the output from the electronic switch multiplier means comprised by switch SW1 (as well as SW2 and SW3). The averaging type current-to-current converter means comprised by operational amplifier $A_1$ provides an output DC current $I_L$ in the floating resistor $R_L$ shown in FIG. 1 (as well as FIG. 5) where the gain of $A_1 >> 1$ and where $R_L$ may represent the internal resistance of a galvonometer type analog DC meter calibrated in terms of watts. The output DC current $I_L$ is representative of the average power P obtained by integration of the resultant output current pulses from the multipliers SW1 (SW2, SW3) over a full line period $T_L$ of the supply alternating voltage and current being monitored. This output DC current $I_L$ is given by the expression:

$$I_L = -I_F\left(1 + \frac{R_3}{R_4}\right) \quad (5)$$

where $I_L$ is independent of $R_L$ due to the feedback action of the current-to-current converter comprised by feedback operational amplifier $A_1$ and the low-pass filter connected in its negative feedback loop. By combining the equations (4) and (5), one can obtain the following expression for $I_L$ for a single phase connection (i.e. 1 channel in FIG. 1 and in FIG. 5):

$$I_L = K\left(1 + \frac{R_3}{R_4}\right) V_P I_P \cos\theta \tag{6}$$

From an examination of equation 6, it will be seen that the output DC current $I_L$ is directly related to the product $V_P I_P \cos\theta$. For balanced polyphased connection, $I_L$ is given by the following expression:

$$I_L = K\sqrt{3}\left(1 + \frac{R_3}{R_4}\right) V_P I_P \cos\theta \tag{7}$$

The single resistor termination of the current transformer $SCT_1$, $SCT_2$ and $SCT_3$ in FIG. 1 (and in FIG. 5) in combination with the electronic multiplier switchess SW1, SW2 and SW3 (which are CMOS switches) to provide the 180° phase inversion of the resultant output signal pulses $i_Z$ from each of the phases, has the following basic advantages as explained more fully in prior U.S. Pat. No. 3,947,763 identified above. The single resistor termination eliminates the need for two closely matched resistors in series which are usually used for center tappedd termination with the center tapped point grounded. Only a single 1–2% resistor R is needed across the secondary windings of each of the current transformers. The total power dissipated in the single resistor R at higher currents is reduced to ½ of the 2R method and becomes significant at large primary currents. Lastly, the size of the current transformer $SCT_1$, $SCT_2$ and $SCT_3$ can be reduced because only one secondary coil is required to assure an adequate output current related signal $v_Y$.

The sampling signal $V_S$ having a frequency $f_S$ and a triangular waveshape is produced by a triangular generator comprised by the components $CO_2$, $CO_3$, FF1, $A_2$, $R_1$ and $C_2$ shown in FIG. 1. This triangular sampling signal generator is a simplified version of a similar generator described in U.S. Pat. No. 3,947,763 noted above. When the voltage $V_T$ at the $R_1$-$A_2$-$C_T$ integrator operational amplifier output reaches the value $+V_{R1}$, the comparator $CO_2$ output sets the flip-flop FF1 and the output of FF1 becomes positive. The integrator will then start to integrate in the negative direction until $V_T$ reaches $-V_{R2}$, etc. The signal $V_T$ is a precise triangular waveshape voltage with an amplitude $V_T = V_{R1} - = V_{R2}$ and a frequency $f_S = \frac{1}{4} R_1 C_2$. The linearity and stability of the triangular waveshape sampling voltage $V_T$ produced by this triangular signal generator is of significant importance. The amplitude of $V_T$ is essentially independent of any variation of $R_1$ and $C_2$ or any other component in the triangular signal generator circuit provided the reference voltages $V_{R1}$ and $-V_{R2}$ are held constant. The relative variation of $V_T$ is given by the expression:

$$\frac{dV_T}{V_T} = \frac{d(V_{R1} + V_{R2})}{V_{R1} + V_{R2}} - \frac{dT_S}{T_S} + \frac{dR_1}{R_1} + \frac{dC_2}{C_2} \tag{8}$$

for $d(V_{R1}+V_{R2})/(V_{R1}+V_{R2})=0$ any variation of $R_1$ and/or $C_2$ causes a compensating variation of $T_S$ in order to keep $dV_T/V_T=0$. A variation of the sampling $T_S$ does not contribute to an error in the electronic switch multipliers.

Figure 5:
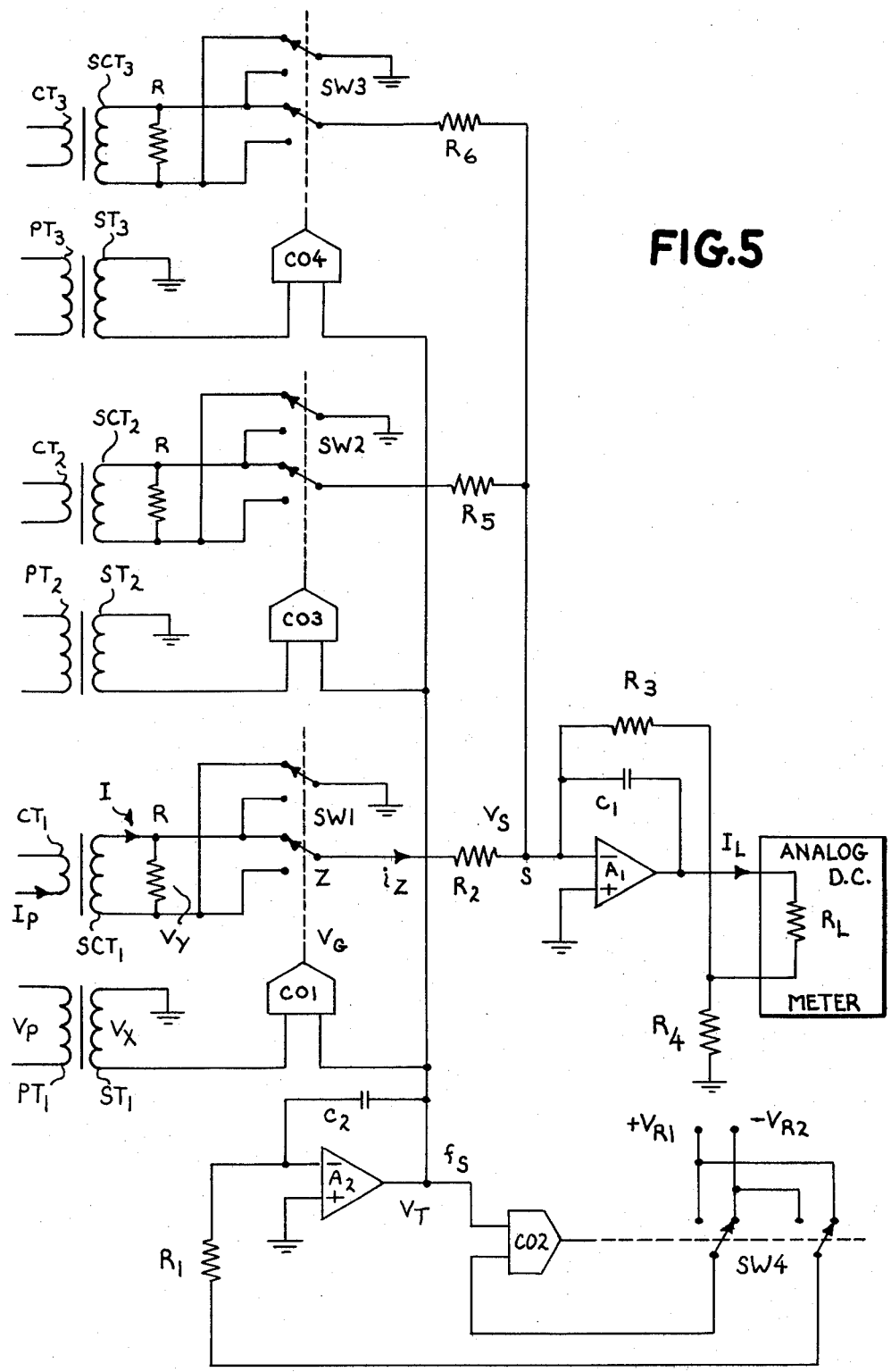
FIG. 5 is a schematic circuit diagram of a polyphase watt-transducer circuit according to the invention which employs a modified triangular sampling signal generator which is somewhat simpler and hence less expensive than the triangular sampling signal generator employed with the FIG. 1 embodiment of the invention.

FIG. 5 of the drawings shows a modified version of a polyphase watt electronic transducer circuit according to the invention which uses a modified triangular sampling signal generator in place of the one described in FIG. 1. Otherwise, the circuit of FIG. 5 is similar in all other respects both in construction and in operation to the FIG. 1 circuit. The triangular sampling signal generator shown in FIG. 5 is comprised by an integrating operational amplifier $A_2$, comparator $CO_2$, electronic switch SW4, resistor $R_1$ and capacitors $C_2$. By a comparison to the triangular sampling signal generator shown oin FIG. 1, it will be appreciated that the triangular generator of FIG. 5 uses fewer electronic components and hence would be less expensive to manufacture. In operation, upon the voltage $V_T$ reaching $-V_{R2}$, comparator $CO_2$ which is a hysteresis type comparator as described in an article by J. Graeme appearing in EDN, Aug. 20, 1975, pages 78–80, produces an output which switches SW4, and thus the input voltage across $R_1$ to integrator amplifier $A_2$ becomes negative. This results in an up-integration of the $V_T$ output voltage. Upon $V_T$ reaching the value $+V_{R1}$, the output from $CO_2$ switches SW4 back to the initial position to produce a down-integration. The resultant triangular waveshaped output signal $V_T$ has an amplitude almost equal to $+V_{R1}$ and of $-V_{R2}$, respectively, and a frequency $f_S = \frac{1}{4} R_1 C_2$. Relative variation of $V_T$ is in accordance with equation (8) set forth above. Assuming constant reference voltages $V_{R1}$ and $-V_{R2}$, any change of resistance in $R_1$ or capacitance of $C_2$, causes a change of $f_S$ which has virtually no effect on the accuracy of operation of the electronic multiplier switches SW1, etc.

From the foregoing description it will be appreciated that the invention provides an improved electronic wattmeter in the form of an electronic watt-transducer circuit requiring a minimum number of components which can be fabricated in monolithic semiconductor integrated circuit form and which provides a direct current output signal that is proportional to watts.

Other modifications and variations of the invention will become apparent to those skilled in the art in the light of the above description. It is therefore to be understood that the invention is not limited to the particular embodiments thereof described. It is therefor to be understood that changes may be made in the particular embodiments of the invention described which are within the full intended scope of the invention as defined by the appended claims.

What is claimed is:

1. In an electronic energy consuption wattmeter for monitoring alternating current electrical energy consumption, the improvement comprising:
   first transformer means having a primary winding excited by the voltage to be measured and a secondary winding providing a voltage related signal proportional thereto;
   second transformer means having a primary winding excited by the current to be measured and a secondary winding providing a current related signal proportional thereto;
   pulse-width modulator means operatively connected to receive said voltage related signal and responsive to a repetitive sampling signal for producing repetitive modulated output pulse signals having instantaneous pulse widths proportional to the corresponding instantaneous magnitude of said voltage related signal;
   double-pole double-throw electronic switch multiplier means operatively connected to be automatically switched between first and second operating states in response to said repetitive modulated output pulse signals;

said electronic switch multiplier means having first and second inputs connected across the secondary winding of the second transformer means and having a switch output which is controllably and alternatively connected to said first switch input during said first switch operating state and to said second switch input during said second operating state, respectively, in response to said modulated output signals from said pulse width modulator means whereby the resultant output electrical signal pulses across said switch output comprise alternating polarity pulse width and amplitude modulated signal pulses having instantaneous pulse widths proportional to said voltage related signal and instantaneous amplitudes proportional to said current related signal and a D.C. component proportional to the product of said voltage related signal and current related signal and hence to the power consumption represented by the electric voltage and electric current being monitored; and averaging type current-to-current converter means connected to the output from said electronic switch multiplier means and supplied with the alternating polarity resultant pulse width and amplitude modulated output signal pulses for averaging the output signal pulses over a full cycle of the alternating current electric energy being monitored and providing an output analog direct current electric signal proportional to watts.

2. An electronic energy consumption wattmeter according to claim 1 wherein the averaging type current-to-current converter means comprises an integrating type operational amplifier having an averaging low pass filter connected in the negative feedback loop thereof for integrating and averaging the resultant alternating polarity pulse width and amplitude modulated output signal pulses over a full operating period of the alternating current energy being monitored.

3. An electronic energy consumption wattmeter according to claim 1 wherein the repetitive modulated output pulse signals produced by said pulse width modulator means in response to the sampling signal have a much higher frequency than the frequency of the alternating current electric energy being monitored.

4. An electronic energy consumption wattmeter according to claim 1 wherein a fixed resistance of predetermined value is connected in shunt across the secondary winding of said second transformer means and said current related signal is derived across said fixed resistance.

5. An electronic energy consumption wattmeter according to claim 2 wherein the repetitive modulated output pulse signals produced by said pulse width modulator means in response to the sampling signal have a much higher frequency than the frequency of the alternating current electric energy being monitored.

6. An electronic energy consumption wattmeter according to claim 5 wherein a fixed resistance of predetermined value is connected in shunt across the secondary winding of said second transformer means and said current related signal is derived across said fixed resistance.

7. An electronic energy consumption wattmeter according to claim 1 wherein the average value of the pulse width and amplitude modulated output signal pulses $i_Z$ having a repetition frequency $f_s$ supplied at the output of the electronic switch multiplier means over an output resistor $R_2$ and averaged over the sampling period $T_S$ where $T_S = 1/f_s$, and which is representative of instantaneous power per phase is given by the expression:

$$i_Z = -\frac{v_X v_Y}{V_T} \frac{1}{R_2}$$

where $v_X$ is the amplitude of the voltage related signal, $v_Y$ is the amplitude of the current related signal and $V_T$ is the voltage of the sampling signal driving the pulse width modulator means; and the average power per phase represented by a current $I_L$ obtained by averaging the instantaneous power $i_Z$ over a full cycle of the alternating current electric energy being monitored, is given by the expression:

$$I_L = K\left(1 + \frac{R_3}{R_4}\right) V_P I_P \cos\theta$$

where K is a dimensional constant, $R_3$ and $R_4$ is the ratio of resistances in a negative feedback path of the averaging type current-to-current converter means, $V_P$ is the primary voltage of first transformer means, $I_P$ is the primary current flowing in the second transformer means and $\cos\theta$ is the phase angle between $V_P$ and $I_P$.

8. An electronic energy consumption wattmeter according to claim 6 wherein the average value of the pulse width and amplitude modulated output signal pulise $i_Z$ having a repetition frequency $f_s$ supplied at the output of the electronic switch multiplier means over an output resistor $R_2$ and averaged over the sampling period $T_S$ where $T_S = 1/f_s$, and which is representative of instantaneous power per phase is given by the expression:

$$i_Z = -\frac{v_X v_Y}{V_T} \frac{1}{R_2}$$

where $V_X$ is the amplitude of the voltage related signal, $v_Y$ is the amplitude of the current related signal and $V_T$ is the voltage of the sampling signal driving the pulse width modulator means; and the average power per phase represented by a current $I_L$ obtained by averaging the instantaneous power $i_Z$ over a full cycle of the alternating current electric energy being monitored, is given by the expression:

$$I_L = K\left(1 + \frac{R_3}{R_4}\right) V_P I_P \cos\theta$$

where K is a dimensional constant, $R_3$ and $R_4$ is the ratio of resistances in a negative feedback path of the averaging type current-to-current converter means, $V_P$ is the primary voltage of first transformer means, $I_P$ is the primary current flowing in the second transformer means and $\cos\theta$ is the phase angle between $V_P$ and $I_P$.

9. A poly-phase electronic energy consumption wattmeter comprising a plurality of electronic energy consumption wattmeters each having first transformer means, second transformer means, pulse width modulator means and double-pole double-throw electronic switch multiplier means for each phase constructed according to claim 1 and further including means for summing the resultant alternating polarity pulse-width and amplitude modulated output signal pulses from each phase at the input to an averaging type current-to-current converter means whereby the output analog direct current signal appearing at the output of the converter is representative of the total watts being supplied by the poly-phase system.

10. A poly-phase electronic energy consumption wattmeter comprising a plurality of electronic energy consumption wattmeters each having first transformer means, second transformer means, pulse width modulator means and double-pole double-throw electronic switch multiplier means for each phase constructed according to claim 7 and further including means for summing the resultant alternating polarity pulse-width and amplitude modulated output signal pulses from each phase at the input to an averaging type current-to-currnt converter means whereby the output analog direct current signal appearing at the output of the converter is representative of the total watts being supplied by the poly-phase system.

11. A poly-phase electronic energy consumption wattmeter comprising a plurality of electronic energy consumption wattmeters each having first transformer means, second transformer means, pulse width modulator means and double-pole double-throw electronic switch multiplier means for each phase constructed according to claim 8 and further including means for summing the resultant alternating polarity pulse-width and amplitude modulated output signal pulses from each phase at the input to an averaging type current-to-current converter means whereby the output analog direct current signal appearing at the output of the converter is representative of the total watts being supplied by the poly-phase system.

12. A poly-phase electronic energy consumption wattmeter according to claim 10 wherein the average power represented by the D.C. analog current $I_L$ for a balanced poly-phase system measured over a full cycle (operating period) of the alternating current electric energy being monitored, is given by the expression:

$$I_L = K\sqrt{3}\left(1 + \frac{R_3}{R_4}\right) V_P I_P \cos\theta.$$

13. A poly-phase electronic energy consumption wattmeter according to claim 11 wherein the average power represented by the D.C. analog current $I_L$ for a balanced poly-phase system measured over a full cycle (operating period) of the alternating current electric energy being monitored, is given by the expression:

$$I_L = K\sqrt{3}\left(1 + \frac{R_3}{R_4}\right) V_P I_P \cos\theta.$$

* * * * *